(12) United States Patent
Casey et al.

(10) Patent No.: US 6,229,218 B1
(45) Date of Patent: May 8, 2001

(54) INTERCONNECT DEVICE AND METHOD FOR MATING DISSIMILAR ELECTRONIC PACKAGE FOOTPRINTS

(75) Inventors: William J. Casey, Meridian; Andrew J. Heidelberg; Daniel C. Skinner, both of Boise, all of ID (US)

(73) Assignee: MCMS, Inc., Nampa, ID (US)

( * ) Notice: Subject to any disclaimer, the term of this patent is extended or adjusted under 35 U.S.C. 154(b) by 0 days.

(21) Appl. No.: 09/187,477

(22) Filed: Nov. 6, 1998

(51) Int. Cl.[7] .................................................... H01L 23/48
(52) U.S. Cl. .......................... 257/778; 257/737; 257/786
(58) Field of Search .................................. 257/701, 778, 257/737, 738, 700, 786

(56) References Cited

U.S. PATENT DOCUMENTS 5,834,848 * 10/1999 Iwasaki ................................. 257/778
5,973,930 * 10/1999 Ikeda et al. .......................... 257/778

* cited by examiner

*Primary Examiner*—Roy Potter
(74) *Attorney, Agent, or Firm*—Joseph W. Holland

(57) ABSTRACT

An interconnect device for connecting an electronic package, whether it be a single chip or a multi-component device, to a primary substrate requiring the mating of dissimilar solder patterns includes a secondary substrate having a first face and a second face. The first face of the secondary substrate may include a first pattern of conductive lands formed on the first face corresponding to a plurality of conductive leads of an electronic package. The second face of the secondary substrate includes a second pattern of conductive lands corresponding to a plurality of conductive lands formed on the primary substrate. The first pattern of conductive lands formed on the first face is electrically connected to the second pattern of conductive lands formed on the second face via surface and internal conductive paths. Solder ball reflow soldering methods are used to connect the electronic device to the secondary substrate and to connect the secondary substrate to the primary substrate.

2 Claims, 3 Drawing Sheets

INTERCONNECT DEVICE AND METHOD FOR MATING DISSIMILAR ELECTRONIC PACKAGE FOOTPRINTS

BACKGROUND OF THE INVENTION

1. Technical Field

This invention generally relates to methods and devices for applying solder to workpieces and more particularly to a method and an apparatus for interconnecting electronic parts requiring the mating of dissimilar package footprints.

2. Background

The evolution of certain component parts employed in the manufacture of electronic assemblies is sometimes more rapid than the evolution of the printed circuit board (PCB) designs. For example if a surface mount component is upgraded from a quad flat pack (QFP) package format to a ball grid array (BGA) format it becomes necessary to redesign an entire PCB. The costs associated with the redesign of an entire PCB may be prohibitive, particularly in applications or manufactured devices having low count runs. Additionally, time may be lost and profits foregone while PCBs are redesigned and retooled to accommodate the evolution of a single component part. Additionally, if there is a large installed user base, it can make field upgrades cost prohibitive.

Potential solutions to this problem may include the use of surface mount socketing devices or the direct attachment of component parts having new or evolved configurations by traditional means of surface mounting and/or manual soldering methods. Others may attach fragile leadframes to the PCB to provide the interconnect method. However, these methods are often labor intensive and typically do not provide high yields. Additionally, these solutions may provide a visually unattractive device or they may be fragile and prone to defect.

Components continue, and will continue to be miniaturized and new and smaller package styles will be developed. As new package styles are developed and adopted by the industry, often it becomes harder and harder to purchase components in the older package styles. Sometimes, the older package styles go End Of Life (EOL) and are no longer produced.

This is not only a problem in manufacturing but also applies to repairing product in the field. When an obsolete part fails it is often necessary to simply replace the entire product as it is too expensive to modify in the field to accept an equivalent part.

What is needed is an efficient way to adapt a new part package to fit onto an existing PCB without redesigning the PCB layout.

SUMMARY OF THE INVENTION

According to one embodiment of the present invention an interconnect device for connecting an electronic package, whether it be a single chip or a multi-component device, to a primary substrate requiring the mating of dissimilar or mismatched solder patterns includes a secondary substrate having a first face and a second face. The first face of the secondary substrate may include a first pattern of conductive lands formed on the first face corresponding to a plurality of conductive leads of an electronic package. The second face of the secondary substrate includes a second pattern of conductive lands corresponding to a plurality of conductive lands formed on the primary substrate. The first pattern of conductive lands formed on the first face is electrically connected to the second pattern of conductive lands formed on the second face via surface and internal conductive paths. Lead-less solder ball solder methods are used to connect the electronic device to the secondary substrate and to connect the secondary substrate to the primary substrate.

The present invention also includes a method for connecting an electronic part to a primary substrate requiring the mating of dissimilar solder patterns. The method uses an interconnect device which has a first surface including a pattern of connection sites to receive the electronic part, a second surface which has a pattern of connection sites to match the connection sites on the primary substrate and a series of connections interconnecting the connection sites of the first and second patterns. The existing pattern of lands on the primary substrate is not altered, thus there is no need to re-work the layout of the primary substrate or PCB. However, the configuration of the individual lands within the existing pattern of lands is altered by masking off selective portions of the lands during manufacture of the PCB.

In one embodiment of the invention, the secondary substrate is formed of any dielectric material, however the most commonly used is FR-4 with a glass transition temperature ($T_g$) of approximately 180° C. This provides a thermally and electrically efficient platform for the construction of such devices. A solder masking process is employed to achieve a reduced surface area of the lands on the original PCB. Advantageously, alternating ends of adjacent lands are masked resulting in increased spacing between solder sites to inhibit bridging of solder between lands and thereby allowing fine pitch package styles to be soldered using solder ball reflow techniques. This also inhibits the possibility of producing low volume solder joints due to the solder reflowing across the entire area of the previous land site. This method allows one to keep existing tooling and PCB designs and still use the standard preformed solder spheres such as those developed by Kester solder. The resulting conductive land array provides adequate clearance to use Eutectic (63% tin–37% lead) solder spheres which have an average melting temperature of 180° C.

Preformed solder spheres may be placed on the patterns of conductive lands formed on the faces of the secondary substrate utilizing a variety of methods including hand placement, the use of mechanical equipment to individually place sphere pre-forms onto a fluxed or solder printed land, the use of a paper array which has pre-formed solder spheres impregnated in the paper matrix which corresponds to the pattern of lands, or high volume placement using a stenciling process.

This secondary substrate can have either the traditional round sphere lands or attachment sites or rectangular lands or attachment sites. This improves the flexibility of the entire integration and provides a standoff height which increases long-term reliability of not only the component but also the PCB assembly as a whole.

One advantage of the present invention is that a user can migrate from one component package style to another without re-designing the existing PCB, and still maintain high assembly yields. This design provides a superior platform for attachment to a PCB over leaded or lead-less chip carrier designs because of increased component to board clearance, robustness of the package, and increased pitch of the connections which decreases the occurrence of solder bridging. The apparatus and method of the present invention not only reduce costs but also increase the reliability of the resulting manufactured parts and employ current methods to solve the interface problem.

Additional advantages and novel features of the invention will be set forth in part in the description that follows, and in part will become apparent to those skilled in the art upon examination of the following, or may be learned by practice of the invention. The advantages of the invention may be realized and attained by means of the instrumentalities and combinations particularly pointed out in the appended claims.

DETAILED DESCRIPTION OF THE INVENTION

Figure 1:
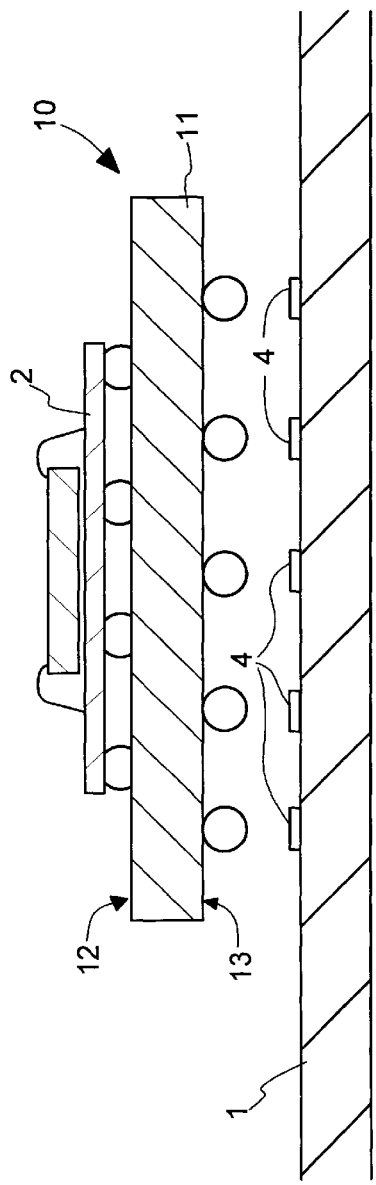
FIG. 1 is a representational side sectional view of a dissimilar solder pattern adapter according to one embodiment of the invention about to be placed on a primary substrate.

Referring now to the figures, an interconnect adapter for mating dissimilar solder patterns between an electronic part and a primary substrate according to the invention is shown in detail and generally designated as 10 therein. Interconnect adapter 10 has a secondary substrate 11 which is here a multi-layer PCB. Secondary substrate 11 includes a first surface 12, also referred to as part side 12, and a second surface 13, also referred to as PCB side 13. A plurality of conductive paths and/or internal connections (not shown) connect solder lands or sites 15 on first surface 12 to various solder lands 15 on second surface 13 as will be explained later.

Solder lands 15 on first surface 12 are arranged in a pattern which corresponds to the pattern of connections on new package replacement part 2, also referred to as the package solder land pattern or simply package pattern, which is here shown as a multi-chip device. Solder lands 15 on second surface 13 are arranged in a pattern which corresponds to the pattern 3 of connections existing on primary substrate or PCB 1, also referred to as the PCB solder land pattern or simply PCB pattern. Solder lands 15 on both first and second surfaces are interconnected on and/or within secondary substrate 11 in the normal manner familiar to those skilled in the art of PCB design. However, there may not be a one-to-one correlation the lands on the two surfaces as some new replacement parts may provide additional functionality and/or require additional supporting electronics to be compatible with the old device.

Figure 2:
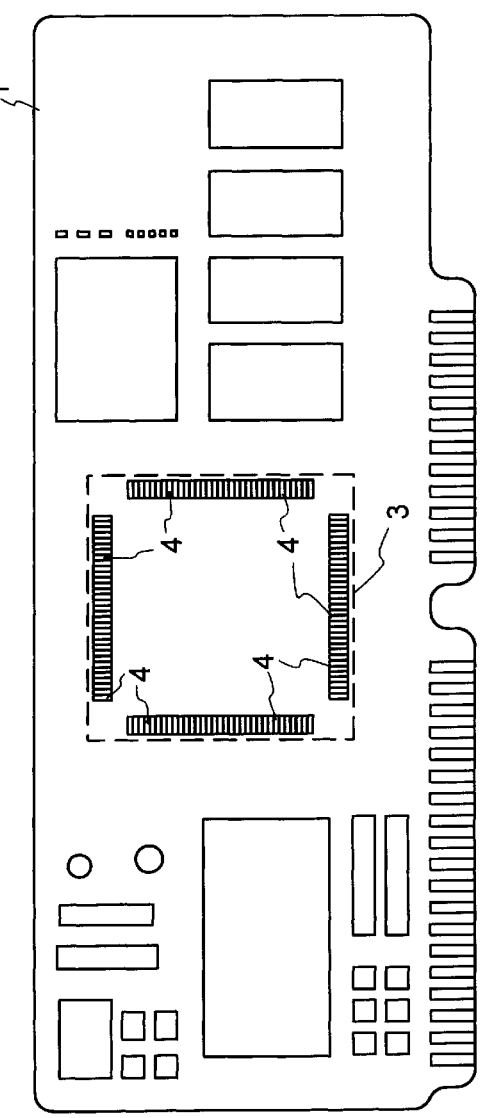
FIG. 2 is a representational side view of an electronic assembly having a solder land pattern which no longer matches the solder land pattern of an new replacement device.
Figure 3:
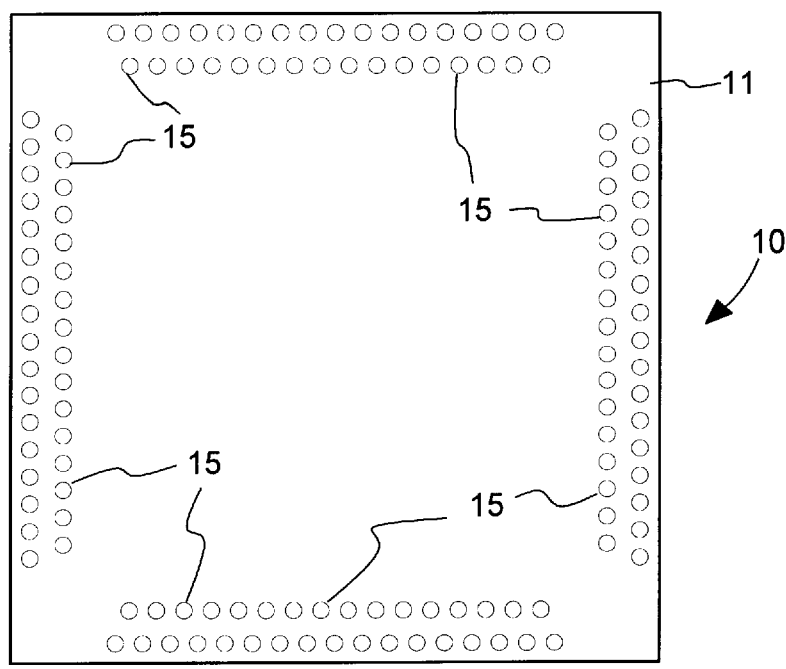
FIG. 3 is a representational bottom view of one embodiment of secondary substrate of a dissimilar solder pattern adapter according to one embodiment of the invention.
Figure 4:
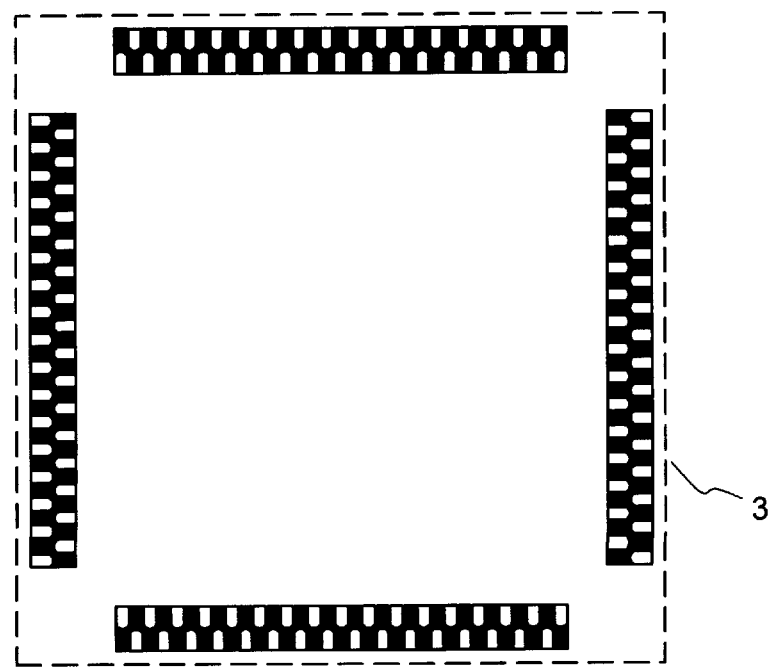
FIG. 4 is a representational top plan view of a solder land pattern on a primary substrate illustrating areas to be masked.
Figure 5:
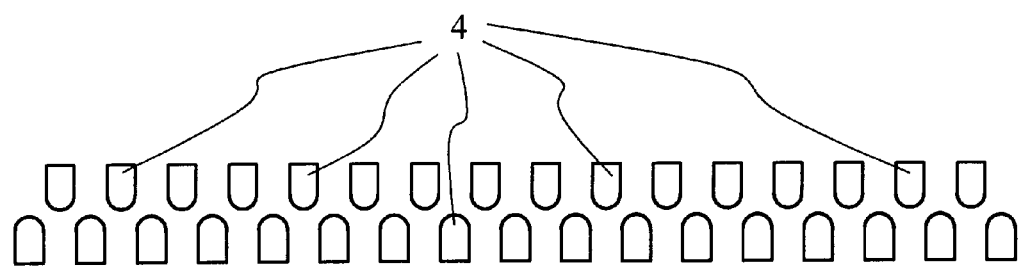
FIG. 5 is a plan view of a solder land pattern on a primary substrate illustrating the results of masking.

FIG. 2 shows an electronic assembly having a solder land pattern 3 which no longer matches the solder land pattern of replacement device 2. FIG. 3 is a bottom view of one embodiment of secondary substrate having a solder pattern arranged to match the pre-existing pattern on primary substrate 1. Advantageously, a portion of each of the primary solder land areas are strategically masked during the manufacture of primary substrate. FIG. 4 shows areas to be masked on the original PCB layout for primary substrate 1. Here, lands 4 are divided into one-third and two-thirds sections from alternating ends on adjacent lands 4. FIG. 5 shows the resulting land pattern. Here, it can be appreciated that the distance between the resulting adjacent solder joints has been increased dramatically which inhibits bridging and inhibits the possibility of low volume solder joints.

Figure 6:
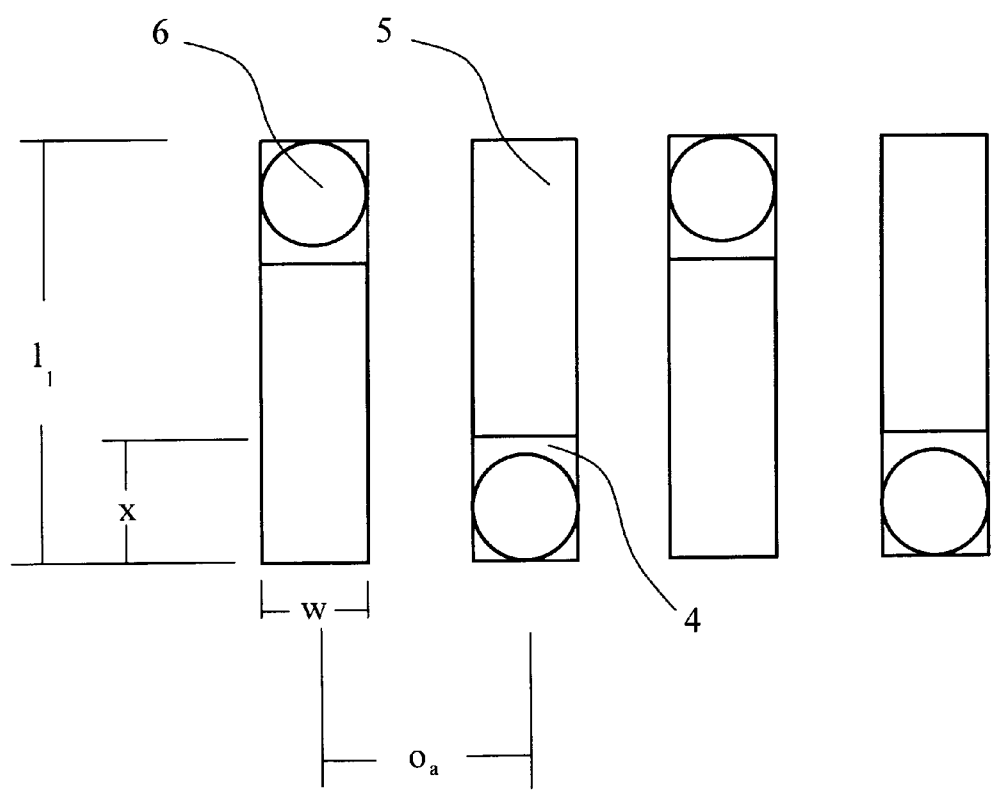
FIG. 6 is a detail plan view of a solder land pattern on a primary substrate illustrating the spacing achieved by strategic masking according to the invention.

FIG. 6 illustrates the increased spacing and clearance achieved by strategic masking according to one embodiment of the invention. In this embodiment the original footprint of land 4 is reduced by applying masking to the area generally designated at 5. The gain in spacing can be expressed as $$\sqrt{\sqrt{(l_1-X)^2+(O_a-W)^2}-(O_a-W)}$$

where $l_1$ is the length of the original footprint of land 4, X is the length of new land 4, $O_a$ is the pitch or spacing between adjacent land centerlines and W is the width of the original footprint of land 4.

While there are shown certain specific embodiments of in accordance with the invention, it is to be distinctly understood that this invention is not limited thereto but may be variously embodied to practice within the scope of the following claims.

We claim:

1. An interconnect device for connecting an electronic package, having a package solder land pattern, to a primary substrate having a PCB solder land pattern different from the package solder land pattern comprising:

a secondary substrate having a first surface and a second surface;

the first surface including a first pattern of conductive lands which matches the package pattern;

the second surface including a second pattern of conductive lands which matches the PCB pattern;

the individual lands within the first pattern of lands being electrically connected to lands within the second pattern of lands and the second pattern of lands; and the individual lands within the second pattern of lands being configured to accept solder ball reflow soldering techniques.

2. The interconnect device of claim 1 wherein the substrate is a planar PCB.

* * * * *